(12) United States Patent
Chuang et al.

(10) Patent No.: US 10,856,409 B1
(45) Date of Patent: Dec. 1, 2020

(54) FOLDABLE BOARD WITH FLEXIBLE PCB COUPLING

(71) Applicant: Quanta Computer Inc., Taoyuan (TW)

(72) Inventors: Chun-Han Chuang, Taoyuan (TW); Ying-Che Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/729,004

(22) Filed: Dec. 27, 2019

(51) Int. Cl.
  *H05K 1/18* (2006.01)
  *H05K 3/36* (2006.01)
  *H05K 1/02* (2006.01)

(52) U.S. Cl.
  CPC ............. *H05K 1/028* (2013.01); *H05K 1/189* (2013.01); *H05K 3/361* (2013.01); *H05K 2201/058* (2013.01); *H05K 2201/10159* (2013.01)

(58) Field of Classification Search
  CPC ........ H05K 1/118; H05K 1/189; H05K 1/147; H05K 3/361; H05K 3/363; H05K 3/365
  See application file for complete search history.

(56) References Cited

U.S. PATENT DOCUMENTS

2013/0148312 A1* 6/2013 Han .................. H05K 1/028
  361/736
2017/0271791 A1* 9/2017 Whatcott .............. H01R 12/62

FOREIGN PATENT DOCUMENTS

JP    WO2016170779 A1 * 10/2016 .............. H05K 3/38

OTHER PUBLICATIONS

Kuraray, Machine Translation of WO2016170779A, Oct. 2016 (Year: 2016).*

* cited by examiner

*Primary Examiner* — Jeremy C Norris
(74) *Attorney, Agent, or Firm* — Nixon Peabody LLP (57) ABSTRACT

A junction between two circuit board segments can be made using a flexible printed circuit board (PCB), permitting the two circuit board segments to be movably positioned with respect to one another, while maintaining electrical connections between the board segments through the junction. Such a design with flexible PCB junctions can allow a single, foldable board with multiple board segments to be used in place of a set of multiple circuit boards that must couple together using connectors and cables.

20 Claims, 9 Drawing Sheets

FOLDABLE BOARD WITH FLEXIBLE PCB COUPLING

TECHNICAL FIELD

The present disclosure relates to computer boards generally and more specifically, to junctions between coupled computer boards.

BACKGROUND

Computer boards are used in various applications, including data centers. It can be highly desirable to maximize efficient usage of space in various applications, despite the need for increasingly complicated computer boards with increasing numbers of circuit traces therein. For example, in data centers, it can be desirable to couple server boards (e.g., mainboards) with data storage boards. Often, such boards are coupled using cables or direct connectors between these boards. However, as the complexity of these boards increase, the number of connections between the boards may increase. Nevertheless, providing such connectors and/or cable receptacles on these boards can increase the amount of space occupied by the boards when assembled.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

Certain embodiments of the present disclosure relate to a foldable board comprising a first board segment, a second board segment, and a flexible junction. The first board segment comprises a first set of circuit traces. The second board segment comprises a second set of circuit traces. The flexible junction operatively couples the first set of circuit traces with the second set of circuit traces. The flexible junction comprises a portion of printed circuit board that flexibly couples the first board segment to the second board segment.

In some cases, the first set of circuit traces and the second set of circuit traces comprise electrical pathways, and wherein the flexible junction electrically couples the first set of circuit traces with the second set of circuit traces. In some cases, the flexible junction is bendable to fold the first board segment with respect to the second board segment such that a plane defined by the first board segment is non-coplanar a plane defined by the second board segment. In some cases, the first set of circuit traces is couplable to a host device and the second set of circuit traces is couplable to an input/output device. In some cases, the first board segment and the second board segment are maneuverable between a storage configuration and a deployed configuration, wherein a plane of the first board segment is coplanar a plane of the second board segment when in the storage configuration, and wherein the plane of the first board segment is non-coplanar the plane of the second board segment when in the deployed configuration. In some cases, the second board segment, when in the deployed configuration, is configured for receiving an input/output device from a direction substantially perpendicular to the plane of the second board segment. In some cases, the portion of the printed circuit board of the flexible junction has a thickness that is thinner than at least one of a thickness of the first board segment and a thickness of the second board segment.

Certain embodiments of the present disclosure relate to a foldable board. The foldable board includes a first component positioned on a first board segment and a second component positioned on a second board segment. A portion of a printed circuit board flexibly couples the first board segment to the second board segment such that the first board segment is rotatable about an axis of rotation with respect to the second board segment. A circuit trace couples the first component to the second component. The circuit trace passes through the portion of the printed circuit board.

In some cases, the circuit trace comprises an electrical circuit trace. In some cases, the portion of the printed circuit board is bendable to fold the first board segment with respect to the second board segment such that a plane defined by the first board segment is non-coplanar a plane defined by the second board segment. In some cases, the first component is couplable to a host device and the second component is couplable to an input/output device. In some cases, the first board segment and the second board segment are maneuverable between a storage configuration and a deployed configuration, wherein a plane of the first board segment is coplanar a plane of the second board segment when in the storage configuration, and wherein the plane of the first board segment is non-coplanar the plane of the second board segment when in the deployed configuration. In some cases, the second board segment, when in the deployed configuration, is configured for receiving an input/output device from a direction substantially perpendicular to the plane of the second board segment. In some cases, the portion of the printed circuit board has a thickness that is thinner than at least one of a thickness of the first board segment and a thickness of the second board segment.

Certain embodiments of the present disclosure relate to a method that provides in a storage configuration, a foldable board having a first board segment flexibly coupled to a second board segment by a portion of a printed circuit board. The foldable board is manipulated into a deployed configuration by flexing the portion of the printed circuit board. The foldable board is secured in a chassis by securing the foldable board in the deployed configuration. Data signals are passed between the first board segment and the second board segment. The data signals are passed through the portion of the printed circuit board.

In some cases, passing data signals comprises passing electrical signals. In some cases, a plane of the first board segment is coplanar a plane of the second board segment when in the storage configuration, and wherein a plane of the first board segment is non-coplanar a plane of the second board segment when in the deployed configuration. In some cases, the second board segment, when in the deployed configuration, is configured for receiving an input/output device from a direction substantially perpendicular to the plane of the second board segment. In some cases, the first board segment is a server mainboard and the second board segment is a storage board, the method further comprising coupling a storage device to the second board segment, and wherein the data signals are associated with the storage device. In some cases, the portion of the printed circuit board has a thickness that is thinner than at least one of a thickness of the first board segment and a thickness of the second board segment.

BRIEF DESCRIPTION OF THE DRAWINGS

The specification makes reference to the following appended figures, in which use of like reference numerals in different figures is intended to illustrate like or analogous components.

DETAILED DESCRIPTION

Certain aspects and features of the present disclosure relate to a junction between two circuit board segments that are made using a flexible printed circuit board (PCB), thereby permitting the two circuit board segments to be movably positioned with respect to one another, while maintaining electrical connections between the board segments through the junction. Such a design with flexible PCB junctions can allow a single, foldable board with multiple board segments to be used in place of a set of multiple circuit boards that must couple together using connectors and cables. For example, in data centers, traditional sever boards and storage boards are often electrically coupled together orthogonally via bulky connectors and/or cables.

As used herein, the term "flexible junction" is inclusive of any technique for physically and operably (e.g., electrically or optically) joining multiple sections of a printed circuit board, such that the multiple sections of the PCB can be moved from a coplanar orientation to a non-coplanar orientation. In some cases, the flexible junction can be continuously flexible throughout a certain range of motion, such that the multiple sections of the PCB are physically and operably joined throughout that range of motion via the flexible junction. In some cases, the flexible junction is integrally formed with the multiple sections of the PCB. In such cases, the flexible junction and the multiple sections of the PCB can be formed as a single, integral board.

A foldable board can include multiple board segments, such as two or more board segments. In some cases, each board segment can have components, electrical circuitry, and/or other functionality associated with a traditional single board (e.g., separate single boards), such as a server mainboard and a storage mainboard. The segments of the foldable board can be coupled together by one or more flexible junctions and optionally, one or more support junctions. Each flexible junction can be made from a flexible PCB material, and can include one or more operative couplings (e.g., electrical traces for electrical couplings or optical pathways for optical couplings) between the circuitry of board segments on either side of the flexible junction. A flexible junction can be known as a flexible bridge. The term "flexible junction," as used herein, can include a flexible PCB with continuous operative couplings (e.g., without any connectors at the junction) coupling two adjacent board segments. In some optional cases, additional support junctions can be provided to provide structural support to facilitate or restrain movement of the board segments with respect to one another. The flexible junction can be configured to have a bending angle that meets the requirements for the anticipated bend angle when the foldable board is in a desired configuration.

The board segments of the foldable board can be positioned in various configurations, such as a storage or transport configuration and a deployed or installed configuration. In a storage or transport configuration, the foldable board may be positioned to minimize storage space or maximize ease of transportation. In some cases, such a storage or transport configuration may have the board segments unfolded to lie on approximately the same plane in a flat configuration, although that need not always be the case. In a deployed or installed configuration, the board segments may be maneuvered to achieve a desired configuration suitable for the desired application. For example, a first board segment may be positioned flat and secured to a bottom plate of a chassis. In contrast, a second board segment may be maneuvered to and secured in place in a position that is at or approximately perpendicular to the first board segment. Therefore, the components or connectors of the second board are oriented in a desirable orientation, so as to facilitate installation of storage devices (e.g., hard disk drives or solid state disk drives).

Additionally, in some cases, flexible junctions can permit a board segment to be moved to a temporary orientation with respect to an adjacent board segment. The purpose is to facilitate installation or configuration of components on the foldable board and/or to facilitate installation of the foldable board into a chassis.

Further, since flexible junctions do not require the use of connectors at the junction between the board segments, much space can be freed up for other components or for increased airflow. For example, a flexible junction can be positioned adjacent to a component, such as a fan. Thus, the fan may be placed adjacent to the board segments meeting at the flexible junction and adjacent to the flexible junction itself.

Additionally, flexible junctions can have a relatively minimal insertion loss when compared to connectors and/or cables. For example, connectors and/or cables can sustain substantial insertion loss (e.g., loss of signal power due to presence of the connector and/or cables), especially at higher frequencies (e.g., at or above 15 GHz), such as on the order of 3-7 dB. By comparison, the use of flexible junctions, as described herein, with respect to the same type of board segments results in an insertion loss on the order of only 1-2 dB. This smaller insertion loss, especially at higher frequencies, can improve system performance when flexible junctions are used, as described herein. Thus, flexible junctions configured to operate at high frequencies (e.g., at or above 5 GHz, 6 GHz, 7 GHz, 8 GHz, 9 GHz, 10 GHz, 11 GHz, 12 GHz, 13 GHz, 14 GHz, or 15 GHz) can be especially useful.

In some cases, a flexible junction can be made using standard printed circuit board (PCB) techniques, and thereafter modify the region of the PCB desired for use as a flexible junction. This region can be modified in a fashion that would permit a desired degree of flexibility (e.g., a desired bend radius). In some cases, a flexible junction can be formed by taking a standard PCB and removing an amount of material (e.g., one or more layers) from the PCB within a region designated to be the flexible junction, thus reducing the thickness of the PCB within that region. This thinning can occur from either planar surface of the PCB, including both planar surfaces of the PCB (e.g., the top and/or bottom of the PCB). When such a region of a PCB is intended to be converted into a flexible junction, the PCB design can ensure that electrical connections in that region only pass through layers that will remain after extra PCB material has been removed to create the flexible junction. Thus, the flexible junction will still maintain the desired electrical connections therethrough. The bend radius desired by the flexible junction can be achieved by adjusting the size and/or depth of the region of material to be removed from the PCB. For example, a flexible junction capable of bending 45° may require removal of less material (e.g., in depth, length, and/or width) than a flexible junction that must support a bend of 90°. While a flexible junction can be created by removing material from a PCB, that need not always be the case. For example, a flexible junction can be created during forming of a PCB by omitting certain layers of the PCB at the flexible junction A foldable board having multiple board segments and a flexible junction therebetween can be formed form a single PCB, however that need not always be the case. In an example, a flexible junction may be created separately and coupled to a standard PCB using a suitable coupling technique, such as a low-profile coupling.

A foldable board can have multiple board segments coupled by one or more flexible junctions. A host device can be associated with a first board segment, such as by being embedded in, directly coupled to (e.g., soldered to), or otherwise coupled to (e.g., connected via a connector to) the first board segment. An input/output device (I/O device) can be associated with a second board segment, such as by being embedded in, directly coupled to (e.g., soldered to), or otherwise coupled to (e.g., connected via a connector to) the second board segment. The flexible junction can convey data signals and/or power between the host device and the I/O device.

In one example, the host device can be a motherboard coupled to the first board segment, and the I/O device can be a storage device coupled to the second board segment. In another example, the host device can be a central processing unit (CPU) on the first board segment, and the I/O device can be a networking interface (e.g., Ethernet or wireless networking interface) on the second board segment (e.g., embedded on or coupled to the second board segment). Other combinations and numbers of host devices and I/O devices can be used with any number of board segments and flexible junctions on a foldable board as disclosed herein.

These illustrative examples are given to introduce the reader to the general subject matter discussed here and are not intended to limit the scope of the disclosed concepts. The following sections describe various additional features and examples with reference to the drawings in which like numerals indicate like elements. Directional descriptions are used to describe the illustrative embodiments but, like the illustrative embodiments, should not be used to limit the present disclosure. The elements included in the illustrations herein may not be drawn to scale.

Figure 1:
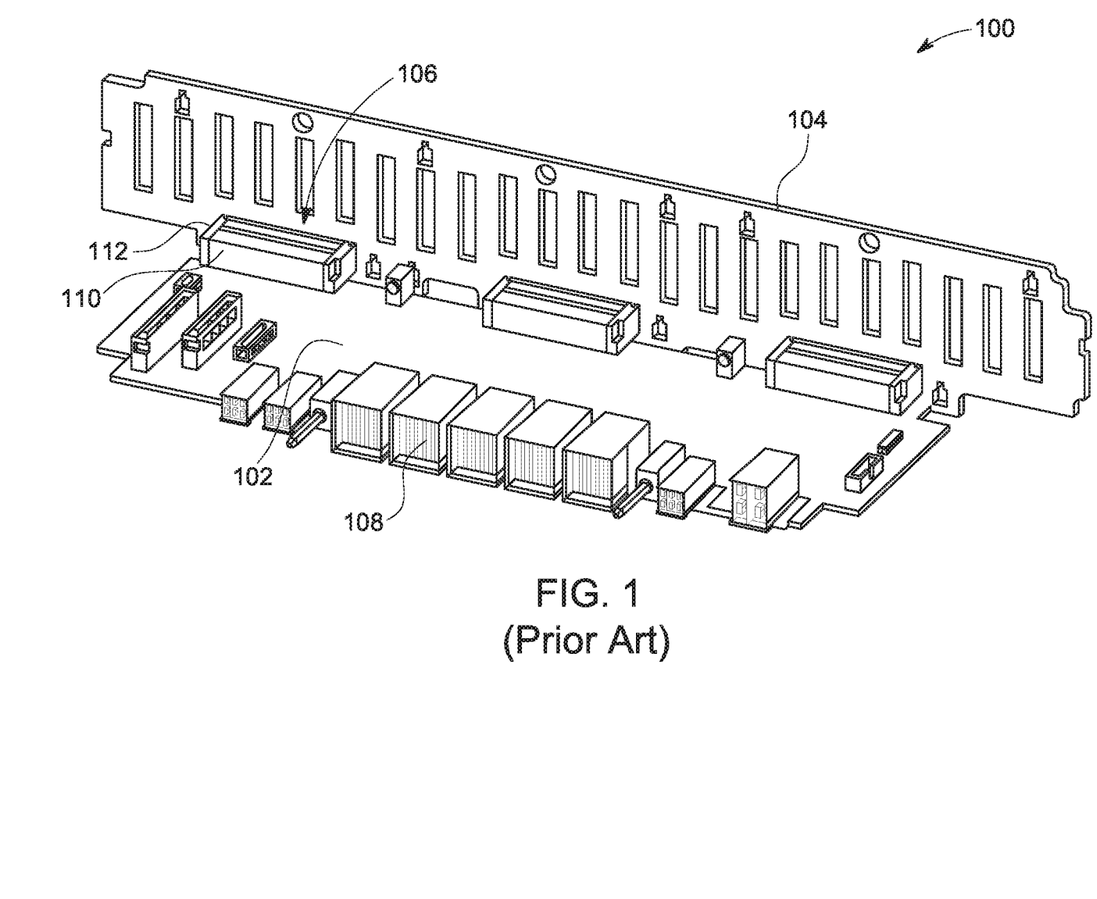
FIG. 1 is an axonometric projection of a traditional mainboard coupled to a storage board.

FIG. 1 is an axonometric projection of a system 100 comprising a traditional mainboard 102 coupled to a storage board 104. The system 100 can be used as part of a computer server, such as in a datacenter. The mainboard 102 can be a printed circuit board comprising any number of electrical circuits and/or electronic components. In some cases, mainboard 102 can include one or more connector ports 108 for communicating with other components, such as other circuit boards of the system 100.

The system 100 can include a storage board 104 for accepting storage devices, such as solid state drives (SSDs) or hard disk drives (HDDs). Storage devices can be coupled to storage board 104 via sockets. The storage board 104 can be coupled to the mainboard 102 perpendicularly to the mainboard 102. Thus, the system 100 can permit storage devices to be coupled to the storage board 104 by inserting such storage devices into a chassis, to connect to the storage board 104 in a direction that is generally parallel to the mainboard 102.

In order for the storage board 104 to communicate with the mainboard 102 in system 100, the storage board 104 must be coupled via connectors 106. Connectors 106 involve a physical connector part 110 on the mainboard 102, and a physical connector part 112 on the storage board 104. The physical connector parts 110, 112 occupy space adjacent the mainboard 102 and storage board 104, and induce electronic noise into the electrical pathways between the storage board 104 and the mainboard 102.

As depicted in FIG. 1, the mainboard 102 can be a traditional linking board, and the storage board 104 can be a traditional hard drive backplane or input/output (I/O) device coupling board.

Figure 2:
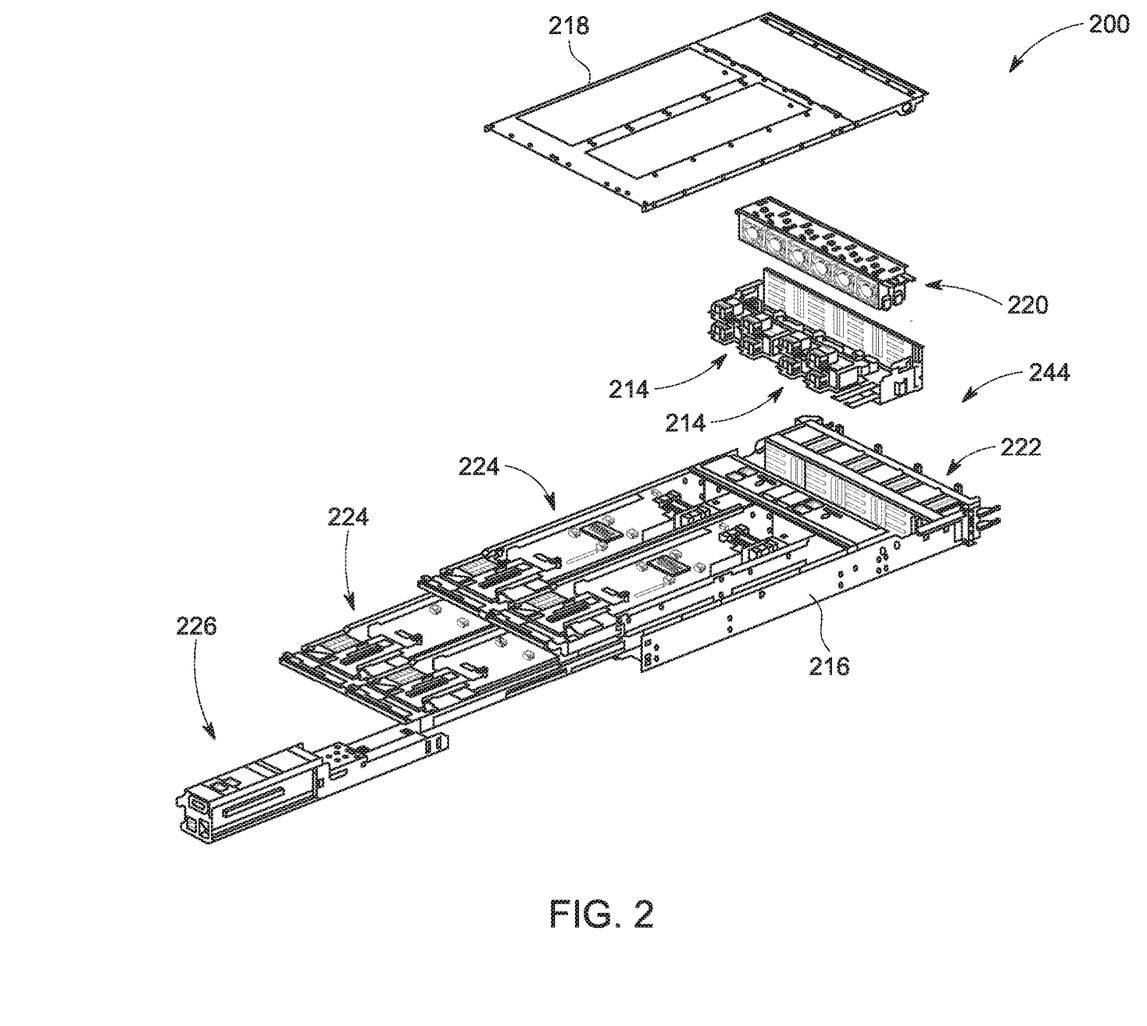
FIG. 2 is an exploded axonometric projection of a foldable board deployed in a chassis, according to certain aspects of the present disclosure.

FIG. 2 is an exploded axonometric projection of a system 200 comprising two foldable boards 214 deployed in a chassis 216, according to certain aspects of the present disclosure. The system 200 can be a computer system, such as a server or set of servers, comprising one or more motherboards 224 coupled to an array of hard drives 222 via the foldable boards 214. A power supply unit 226 can provide power to the system 200. The one or more motherboards 224 can be secured in chassis 216, such as towards the rear of the chassis 216. The array of hard drives 222 can be secured in chassis 216, such as towards the front of the chassis 216. A chassis cover 218 can cover the top of chassis 216.

In order to provide convenient access to monitor, install, remove, and/or replace each hard drive in the array of hard drives 222, chassis 216 can include a frame into which each hard drive can be inserted (e.g., slid-in) from the front 244 of the chassis 216. To facilitate this orientation of the hard drives, each foldable board 214 can include a vertical portion that functions akin to an I/O device coupling board (e.g., a hard drive backplane) to receive and couple to the hard drives, as well as a horizontal portion containing the connectors necessary to connect the hard drives to the motherboards 224. Thus, each foldable board 214 can include flexible junctions, as disclosed herein, to permit the foldable board 214 to operate as a combined linking board and I/O device coupling board (e.g., combined linking board and hard drive backplane). Because of the use of the flexible junctions and the lack of connectors between a traditional linking board and a traditional I/O device coupling board, not only is the data connection between the array of hard drives 222 and the motherboards 224 improved, but the increased empty space behind the hard drives can achieve improved airflow with the use of a fan array 220. The fan array 220 can be a traditional fan array, or can be a larger fan array designed to maximize the available space once occupied by the connectors between a traditional linking board and a traditional I/O device coupling board.

As depicted in FIG. 2, the chassis 216 is a 2 unit (2U) chassis containing four motherboards 224, one power supply unit 226, two foldable boards 214, twenty four hard drives in an array of hard drives 222, and six fans in a fan array 220. However, aspects of the present disclosure can be used with any sized chassis 216, any number of motherboards 224, any number of power supply units 226, any number of hard drives in an array of hard drives 222, and any number of fans in a fan array 220; as well as with fewer or additional types of components. In some cases, a foldable board, as disclosed herein, can perform some or all of the functions of other components depicted in FIG. 2, such as a foldable board that also comprises one or more motherboards and/or one or more power supply units.

Figure 3:
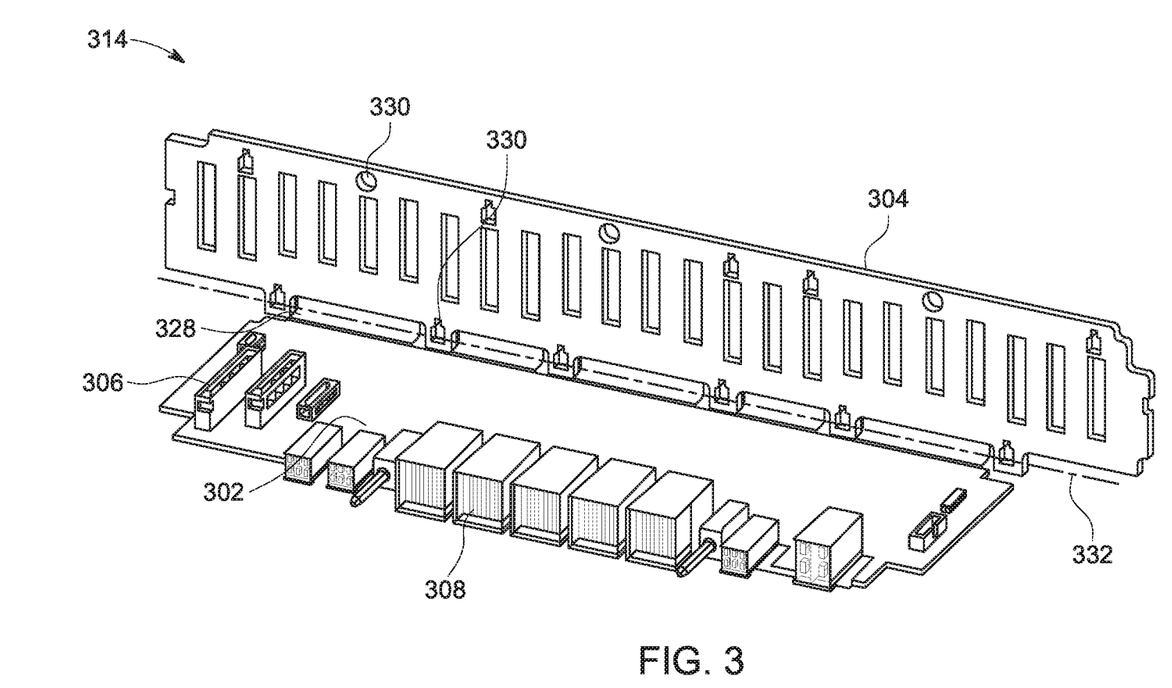
FIG. 3 is an axonometric projection of a foldable board comprising a mainboard segment flexibly coupled to a storage board segment, according to certain aspects of the present disclosure.

FIG. 3 is an axonometric projection of a foldable board 314 comprising a mainboard segment 302 flexibly coupled to a storage board segment 304, according to certain aspects of the present disclosure. Foldable board 314 can be foldable board 214 of FIG. 2. The foldable board 314 can be used as part of a computer server, such as in a data center. The foldable board 314 can be formed form a single printed circuit board that has been altered to permit folding of a flexible junction 328 along bend axis 332, while maintaining signal traces (e.g., electrical traces) throughout the flexible junction 328. The foldable board 314 can be a single printed circuit board comprising a mainboard segment 302 and a storage board segment 304 coupled together through the flexible junction 328.

Foldable board 314 can be designed to operate similarly to system 100 of FIG. 1. For example, mainboard segment 302 can be designed similarly to mainboard 102 of FIG. 1, however without any connectors for coupling to a storage board since foldable board 314 includes an integral storage board segment 304. Likewise, storage board segment 304 can be designed similarly to storage board 104 of FIG. 1, however without any connectors for coupling to a mainboard since foldable board 314 includes an integral mainboard segment 302. For example, mainboard segment 302 can include any number of connector ports 308 for communicating with other components, such as other circuit boards (e.g., motherboards of a server). Storage board segment 304 can include any number of sockets for accepting storage devices, such as solid state drives (SSDs) or hard disk drives (HDDs).

The flexible junction 328 can be formed using any suitable technique, such as those disclosed herein. For example, flexible junction 328 can be formed by thinning a portion of the printed circuit board of the foldable board 314 to a sufficient thinness capable of achieving a desired bending radius about bend axis 332. Specifically, foldable board 314 has a flexible junction 328 capable of achieving a bend angle of at or approximately 90°, which can facilitate insertion of hard drives on to the storage board segment 304 while the mainboard segment 302 is coupled to a motherboard of a server.

In some cases, one or both board segments (e.g., mainboard segment 302 and storage board segment 304) can include anchor points 330 for securing the foldable board 314 to a chassis or other frame. Anchor points 330 can help retain the shape and orientation of the board segments with respect to one another after they have been folded into position. For example, foldable board 314 can be manufactured in a flat orientation, but folded into the folded configuration depicted in FIG. 3 prior to installation in a chassis. When installed in the chassis, the foldable board 314 can be secured to the chassis using anchor points 330 (e.g., by installing screws or bolts through anchor points 330 or any other suitable technique). In some cases, some anchor points 330 can be located between portions of the flexible junction 328, such as depicted in FIG. 3, however that need not always be the case. In some other cases, a single, unbroken flexible junction 328 can couple a mainboard segment 302 to a storage board segment 304.

The flexible junction 328 can include a number of signal pathways, such as electrically conductive traces, that couple signal traces on the storage board segment 304 to signal traces on the mainboard segment 302. Thus, signals from storage drives coupled to storage board segment 304 can pass through the signal pathways of the flexible junction 328 to the mainboard 302. In some cases, these signals can be passed along to additional devices through connectors 306. Likewise, signals from other devices and/or the mainboard segment 302 can pass through the flexible junction 328 to storage drives coupled to the storage board segment 304.

As depicted in FIG. 3, foldable board can operate as a combined linking board and hard drive backplane or input/output (I/O) device coupling board. However, a flexible junction, as depicted and described with reference to FIG. 3 and herein, can be used for other purposes with other types of board segments.

Figure 4:
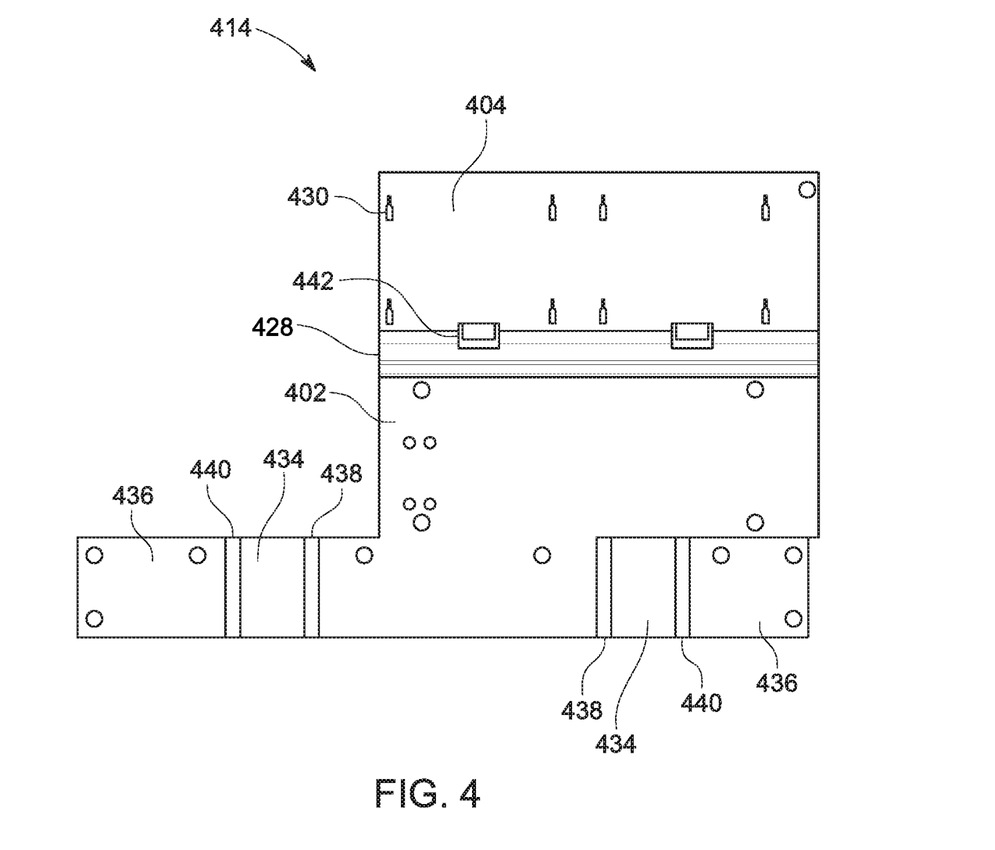
FIG. 4 is an overhead schematic view of a foldable board in a storage configuration, according to certain aspects of the present disclosures.

FIG. 4 is an overhead schematic view of a foldable board 414 in a storage configuration, according to certain aspects of the present disclosures. Foldable board 414 can be foldable board 214 of FIG. 2 prior to insertion in a chassis. Foldable board 414 can include any number of segments, although the particular foldable board 414 depicted in FIG. 4 includes a storage board segment 404, a mainboard segment 402, a pair of riser board segments 434, and a pair of mezzanine board segments 436. The storage board segment 404 can be coupled to the mainboard segment 402 via a flexible junction 428. Mainboard segment 402 can be coupled to riser board segments 434 via flexible junctions 438. Riser board segments 434 can be coupled to mezzanine board segments 436 via flexible junctions 440. Flexible junctions 428, 438, 440 can be similar to flexible junction 328 of FIG. 3.

In some cases, one or both board segments joined by a flexible junction can include a mechanical feature designed to facilitate securing one or both of the board segments in a chassis. For example, mechanical feature 442 can be an extension of the storage board segment 404 that is designed to fit inside an opening (e.g., slot) in the chassis when the storage board segment 404 is folded into a deployed configuration and secured into a chassis. For example, to hold the storage board segment 404 in place, the mechanical feature 442 can be fit into an opening of the chassis to secure the bottom part of the storage board segment 404, while the top part of the storage board segment 404 can be secured in place using anchor points 430.

Figure 5:
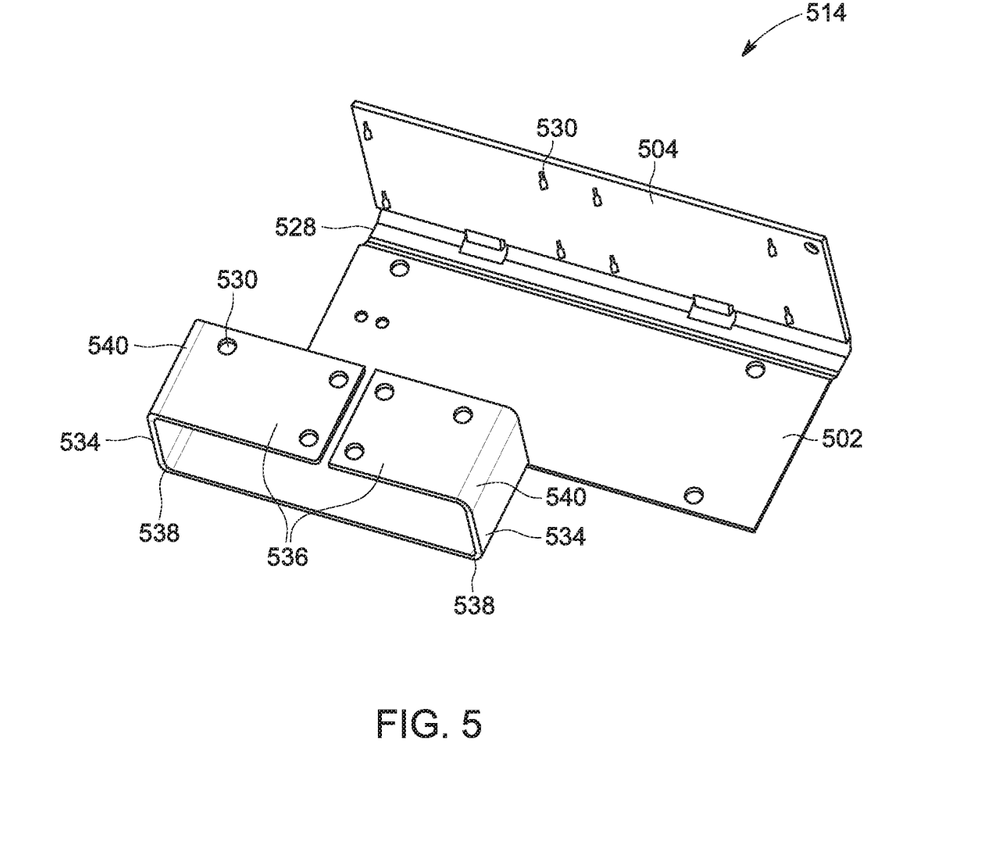
FIG. 5 is an axonometric projection of a foldable board in a deployed configuration, according to certain aspects of the present disclosure.

When in the storage configuration, foldable board 414 can be substantially flat (e.g., each segment 404, 402, 434, 436 coplanar). For illustrative purposes, the various connectors and/or components used on foldable board 414 are not depicted in FIG. 4. For illustrative purposes additional ventilation cutouts (e.g., cutouts in storage board segment 304 of FIG. 3) are also not depicted in FIG. 4. When foldable board 414 is desired to be used in a system, the various board segments can be folded at their respective flexible junctions into a deployed configuration, such as depicted in FIG. 5. The storage board segment 404 can be folded perpendicular to the mainboard segment 402 to facilitate coupling of storage devices. The riser board segments 434 can be folded perpendicular to the mainboard segment 402, and mezzanine board segments 436 can be folded perpendicular to the riser board segments 434, and thus parallel to mainboard segment 402.

The foldable board 414 can be especially useful for coupling an array of hard drives to a stacked set of motherboards, such as in a 2U or greater chassis. Any number of or size of riser board segments 434 and mezzanine board segments 436 can be used to increase the effective height of the foldable board 414 when folded. For example, as depicted, the riser board segments 434 can be folded to put the mezzanine board segments 436 into a position approximately one rack unit (1U) above the mainboard segment 402. In some cases, additional riser board segments and mezzanine segments can be coupled to the mezzanine board segments 436 to further add additional tiers. In some cases, riser board segments 434 can be wider to effectively raise the mezzanine board segments 436 to higher tiers (e.g., two or more rack units above the mainboard 402).

FIG. 5 is an axonometric projection of a foldable board 514 in a deployed configuration, according to certain aspects of the present disclosure. Foldable board 514 can be foldable board 414 (of FIG. 4) after being folded into a deployed configuration. Folding foldable board 514 into a deployed configuration can involve bending each flexible junction 528, 538, 540 an appropriate amount (e.g., 90° as depicted in FIG. 5). For illustrative purposes, the various components and/or connectors of foldable board 514 are not depicted in FIG. 5. For illustrative purposes additional ventilation cutouts (e.g., cutouts in storage board segment 304 of FIG. 3) are not depicted in FIG. 5. Once in a deployed configuration, the storage board segment 504 can be at or approximately perpendicular to mainboard 502, which can be at or approximately perpendicular to riser boards 534, which can be at or approximately perpendicular to mezzanine board segments 536. Thus, various complex three-dimensional board designs can be achieved using a single, integral printed circuit board through the use of flexible junctions (e.g., flexible junctions 528, 538, 540).

Anchor points 530 can be used to secure the board segments in place. For example, anchor points 530 of the storage board segment 504 can be used to couple the storage board segment 504 to a chassis or other frame. In some cases, an anchor point 530 can be coupled to an intermediate frame. For example, anchor point 530 of the mezzanine board segments 536 can be coupled to an intermediate frame that is a structural component designed to help structurally support the mezzanine board segments 536 in the deployed configuration. For example, an intermediate frame can be one or more plastic pieces sandwiched between the mezzanine board segments 536 and the mainboard segment 502, although any other suitable frame can be used. In some cases, a connector coupled to mainboard 502 can perform the same functions as an intermediate frame.

Figure 6:
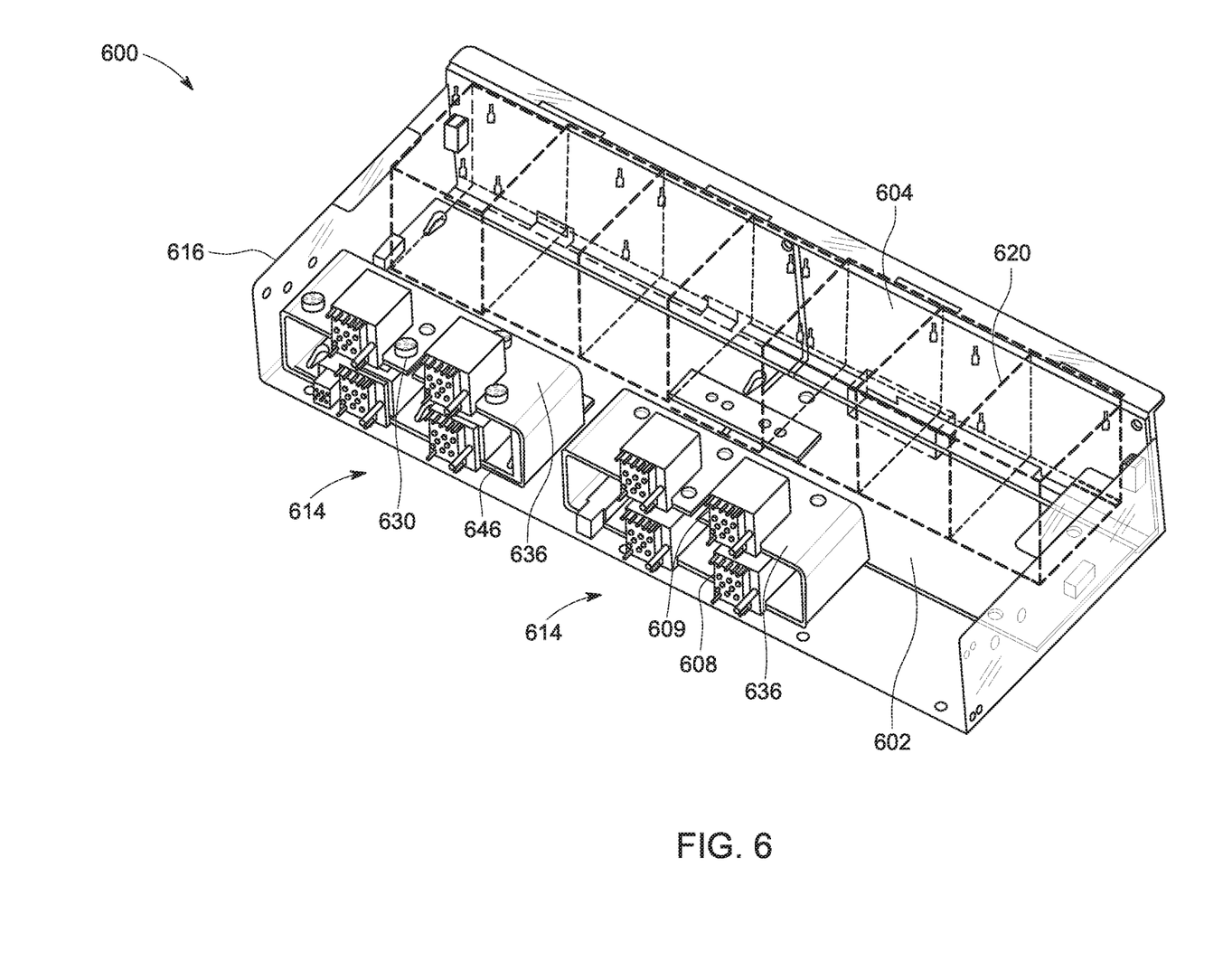
FIG. 6 is an axonometric projection of a set of foldable boards mounted in a chassis, according to certain aspects of the present disclosure.

FIG. 6 is an axonometric projection of a set of foldable boards 614 mounted in a chassis 616, according to certain aspects of the present disclosure. The system 600 of FIG. 6 can be similar to the foldable boards 214 of FIG. 2. For illustrative purposes, some of the various components and/or connectors of foldable boards 614 are not depicted in FIG. 6. For illustrative purposes additional ventilation cutouts (e.g., cutouts in storage board segment 304 of FIG. 3) are not depicted in FIG. 6. Each foldable board 614 can be similar to foldable board 514 of FIG. 5.

Each foldable board 614 can include a storage board segment 604 and a mainboard segment 602 coupled via a flexible junction. The mainboard segment 602 can include connectors 608 for coupling the mainboard segment 602 to additional components (e.g., a motherboard, such as motherboard 224 of FIG. 2). The foldable board 614 can further include mezzanine board segments 636 with their own connectors 609, for coupling the mainboard segment 602 to additional components on a separate vertical level from mainboard segment 602 (e.g., to stacked motherboards, such as stacked motherboards 224 of FIG. 2).

In some cases, a mezzanine board segment 636 can be supported in place via anchor points 630 coupling the mezzanine board segment 636 to an intermediate frame 646. In some cases, a fan array 620 can be installed behind the storage board segment 604. For illustrative purposes, the fan array 620 is depicted in FIG. 6 as dashed lines. The use of a foldable board 614, as disclosed herein, can permit fan array 620 to better move air through system 600.

Figure 7:
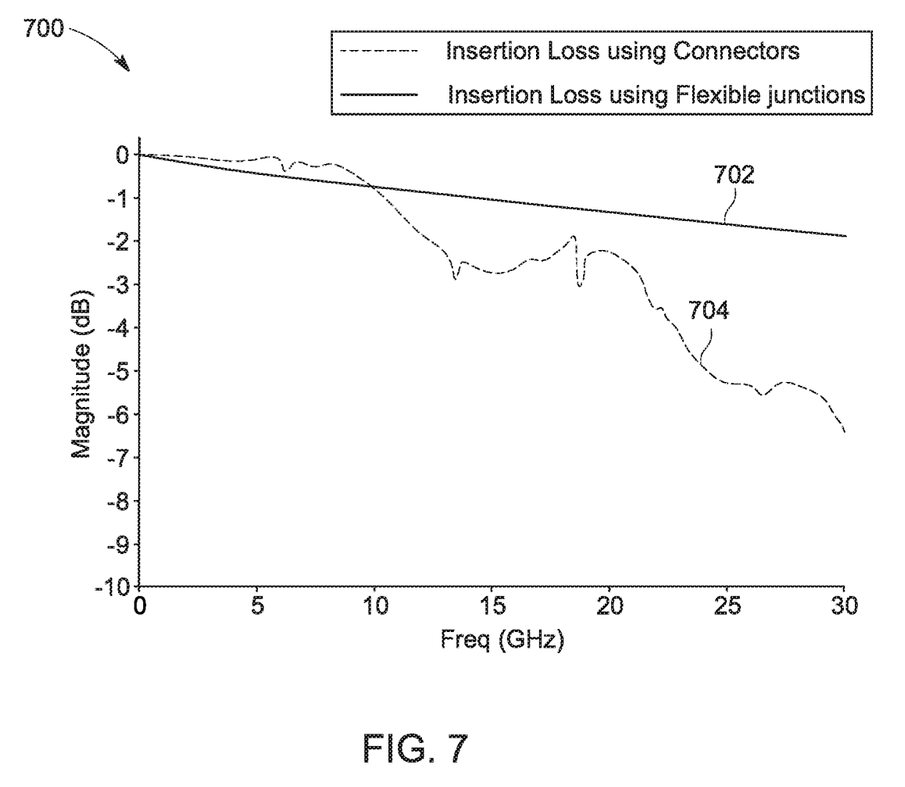
FIG. 7 is a chart depicting insertion loss associated with a traditional board coupling with respect to insertion loss associated with a flexible junction, according to certain aspects of the present disclosure.

FIG. 7 is a chart 700 depicting insertion loss associated with a traditional board coupling with respect to insertion loss associated with a flexible junction, according to certain aspects of the present disclosure. Line 704 depicts the insertion loss magnitude, in dB, for a traditional connector used to connect a linking board to a storage drive board. It is clear that especially at higher frequencies, substantial insertion loss occurs. However, line 702 depicts the insertion loss magnitude, in dB, for a flexible junction as disclosed herein when used to connect a linking board to a storage drive board. As expected for a printed circuit board component, the insertion loss at higher frequencies only drops minimally, performing much better than that of a traditional connector. Thus, it is clear that the flexible junctions disclosed herein can substantially improve signal for high-frequency applications, thus substantially improving throughput and potentially reducing power requirements.

Figure 8:
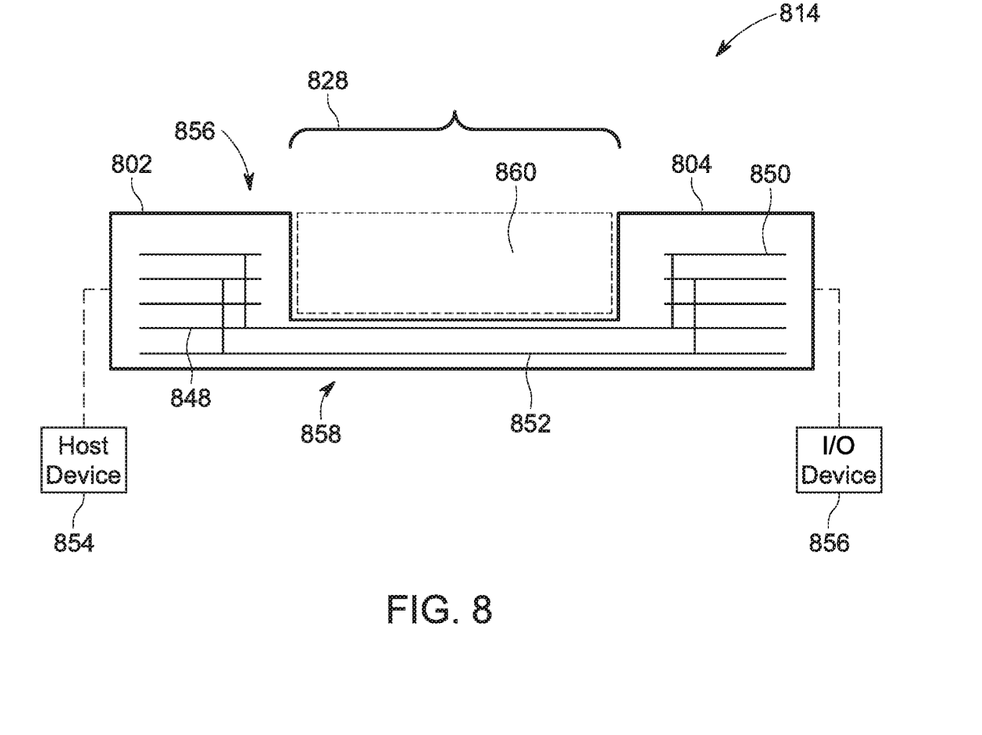
FIG. 8 is a schematic side view depicting a flexible junction, according to certain aspects of the present disclosure.

FIG. 8 is a schematic side view depicting a flexible junction 828 according to certain aspects of the present disclosure. The flexible junction 828 can be flexible junction 328 of FIG. 3 or any other suitable flexible junction as disclosed herein. The flexible junction 828 can couple a first board segment 802 (e.g., mainboard segment) and a second board segment 804 (e.g., storage board segment) of a foldable board 814.

The flexible junction 828 of FIG. 8 can be formed by taking a standard printed circuit board and removing portion 860. This portion 860 can be known as an excavation region, although any suitable technique can be used for removing that portion of printed circuit board. In some cases, other techniques can be used to form a flexible junction, 828, as disclosed herein.

As depicted in FIG. 8, the portion 860 of removed PCB was removed from a top surface 856 of the PCB, although that need not always be the case. In some cases, the flexible junction 828 can be formed by removing a portion 860 from a bottom surface 858 of the PCB. In some cases, the flexible junction 828 can be formed by removing a portion 860 from both a top surface 856 and a bottom surface 858 of the PCB.

The PCB can contain various signal traces 848, 850, 852 (e.g., electrical traces) for conveying signals. These signal traces 848, 850, 852 can be formed within layers of the PCB of the foldable board 814. Vias can be used to connect signal traces on different layers. The first board segment 802 can include signal traces 848; the second board segment 804 can include signal traces 850; and the flexible junction 828 can include signal traces 852. The flexible junction 828 can include signal traces 850 (e.g., embedded signal traces) that convey signals between the signal traces 848 of the first board segment 802 and the signal traces 850 of the second board segment 804. While the signal traces 852 of the flexible junction 828 are depicted as located within internal layers of the PCB, in some cases such signal traces 852 can be located on an exposed surface, such as bottom surface 858 or the opposite surface at the flexible junction 828.

The first board segment 802 can include and/or couple to a host device 854 (e.g., a central processing unit or a motherboard), such as a host device 854 coupled directly (e.g., soldered directly) to the first board segment 802, or a host device 854 coupled to the first board segment 802 through one or more connectors. The second board segment 804 can include and/or couple to an I/O device 856 (e.g., a storage device, a network card, or any other input and/or output device), such as an I/O device 856 coupled directly (e.g., soldered directly) to the second board segment 804 or an I/O device 856 coupled to the second board segment 804 through one or more connectors (e.g., sockets). The flexible junction 828 can convey signals between the I/O device 856 and the host device 854.

Figure 9:
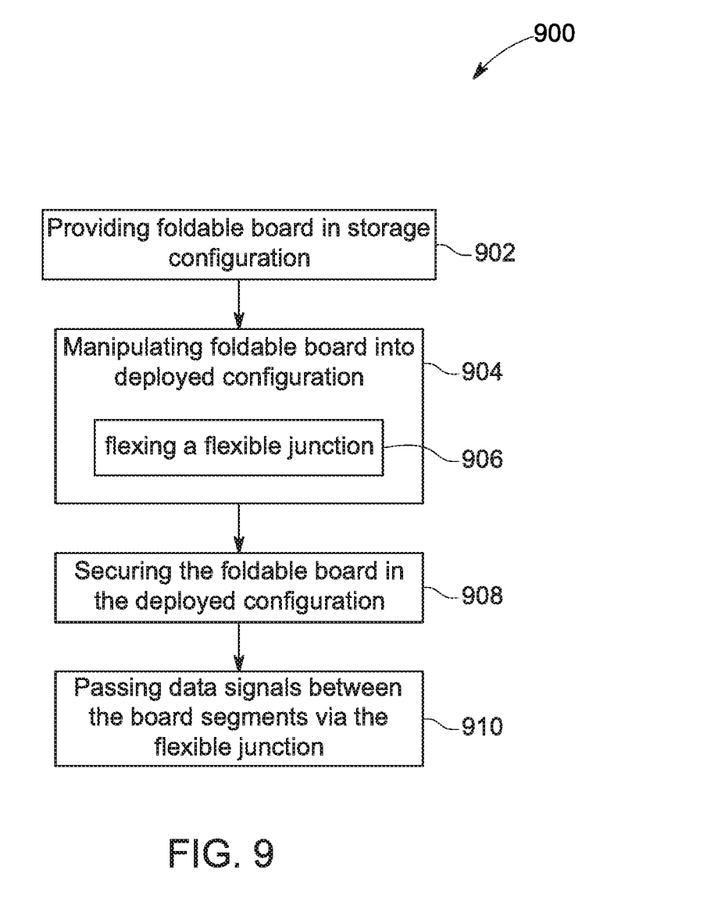
FIG. 9 is a flowchart depicting a process for using a foldable board, according to certain aspects of the present disclosure.

FIG. 9 is a flowchart depicting a process 900 for using a foldable board according to certain aspects of the present disclosure. Process 900 can be used with foldable board 414 of FIG. 4 or any other suitable foldable board as disclosed herein. At step 902, a foldable board can be provided in a storage configuration. In the storage configuration, the foldable board can be generally flat, with each of its board segments generally coplanar.

At step 904, the foldable board can be manipulated into a deployed configuration. Manipulating the foldable board into a deployed configuration can include flexing or bending one or more flexible junctions of the foldable board at step 906. At step 908, the foldable board can be secured in its deployed configuration. In some cases, securing the foldable board in the deployed configuration can include securing the foldable board to a chassis. In some cases, securing the foldable board in the deployed configuration can include securing the foldable board to a frame, which can optionally be placed in and/or secured to a chassis. Securing the foldable board in a chassis at step 908 can help keep the foldable board in its deployed configuration.

At step 910, data signals can be passed between the board segments of the foldable board via the flexible junction. Passing data signals at step 910 can include passing data signals from circuit traces of one board segment to circuit traces of a second board segment. In some cases, passing data signals at step 910 can include passing data signals from a host device coupled to a first board segment to an input/output device coupled to a second board segment via a flexible junction (e.g., the flexible junction flexed at block 906).

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

What is claimed is:

1. A foldable board, comprising:
   a mainboard segment of a printed circuit board for supporting one or more connectors couplable to a motherboard, the mainboard segment comprising a first set of circuit traces;
   a mezzanine board segment of the printed circuit board, the mezzanine board segment comprising a second set of circuit traces;
   a storage board segment of the printed circuit board for receiving one or more storage devices, the storage board segment comprising a third set of circuit traces;
   at least one flexible junction comprising at least one portion of the printed circuit board flexibly coupling the mezzanine board segment to the mainboard segment, the at least one flexible junction bendable to move the mezzanine board segment between a position coplanar the mainboard segment to a position parallel to and spaced apart from the mainboard segment;
   an additional flexible junction operatively coupling the first set of circuit traces and the second set of circuit traces to the third set of circuit traces, wherein the additional flexible junction comprises an additional portion of the printed circuit board flexibly coupling the mainboard segment to the storage board segment.

2. The foldable board of claim 1, wherein the additional flexible junction is bendable to fold the mainboard segment with respect to the storage board segment such that a plane defined by the mainboard segment is non-coplanar a plane defined by the storage board segment.

3. The foldable board of claim 1, wherein the first set of circuit traces is couplable to a host device via the one or more connectors of the mainboard segment, and the third set of circuit traces is couplable to an input/output device.

4. The foldable board of claim 1, wherein the mainboard segment and the storage board segment are maneuverable between a storage configuration and a deployed configuration, wherein a plane of the mainboard segment is coplanar a plane of the storage board segment when in the storage configuration, and wherein the plane of the mainboard segment is non-coplanar the plane of the storage board segment when in the deployed configuration.

5. The foldable board of claim 4, wherein the storage board segment, when in the deployed configuration, is configured for receiving an input/output device from a direction substantially perpendicular to the plane of the storage board segment and substantially parallel to the plane of the mainboard segment.

6. The foldable board of claim 1, wherein the mezzanine board segment supports one or more additional connectors couplable to an additional motherboard positioned over the motherboard.

7. The foldable board of claim 1, wherein the at least one flexible junction includes a first flexible junction and a second flexible junction coupled together by a riser board segment, and wherein when the mezzanine board segment is parallel to and spaced apart from the mainboard segment, the riser board segment is in the position perpendicular to the mainboard segment and the mezzanine board segment.

8. A foldable board, comprising:
   a first connector positioned on a mainboard segment of a printed circuit board;
   a component position on a mezzanine board segment of the printed circuit board;

a second connector positioned on a storage board segment of the printed circuit board;
at least one portion of the printed circuit board flexibly coupling the mezzanine board segment to the mainboard segment, the at least one portion of the printed circuit board bendable to move the mezzanine board segment between a position coplanar the mainboard segment to a position parallel to and spaced apart from the mainboard segment;
an additional portion of the printed circuit board flexibly coupling the mainboard segment to the storage board segment such that the mainboard segment is rotatable about an axis of rotation with respect to the storage board segment; and
circuit traces coupling the first connector and the component to the second connector, wherein the circuit traces pass through the additional portion of the printed circuit board.

9. The foldable board of claim 8, wherein the additional portion of the printed circuit board is bendable to fold the mainboard segment with respect to the storage board segment such that a plane defined by the mainboard segment is non-coplanar a plane defined by the storage board segment.

10. The foldable board of claim 8, wherein the first connector is couplable to a host device, and the second connector is couplable to an input/output device.

11. The foldable board of claim 8, wherein the mainboard segment and the storage board segment are maneuverable between a storage configuration and a deployed configuration, wherein a plane of the mainboard segment is coplanar a plane of the storage board segment when in the storage configuration, and wherein the plane of the mainboard segment is non-coplanar the plane of the storage board segment when in the deployed configuration.

12. The foldable board of claim 11, wherein the storage board segment, when in the deployed configuration, is configured for receiving an input/output device from a direction substantially perpendicular to the plane of the storage board segment and substantially parallel to the plane of the mainboard segment.

13. The foldable board of claim 8, wherein the first connector is couplable to a first host device, wherein the component of the mezzanine board segment is a third connector, and wherein the third connector is couplable to a second host device.

14. The foldable board of claim 8, wherein the at least one portion of the printed circuit board includes a first flexible junction and a second flexible junction coupled together by a riser board segment, and wherein when the mezzanine board segment is in the position parallel to and spaced apart from the mainboard segment, the riser board segment is perpendicular to the mainboard segment and the mezzanine board segment.

15. A method, comprising:
providing, in a storage configuration, a foldable board comprising a mainboard segment of a printed circuit board, the mainboard segment being flexibly coupled to a mezzanine board segment of the printed circuit board and a storage board segment of the printed circuit board by portions of the printed circuit board;
manipulating the foldable board into a deployed configuration by flexing the portions of the printed circuit board, wherein flexing the portions of the printed circuit board includes moving the mezzanine board segment from a position coplanar to the mainboard segment to a position parallel to and spaced apart from the mainboard segment;
securing the foldable board in a chassis, wherein securing the foldable board comprises securing the foldable board in the deployed configuration; and
passing data signals between the storage board segment and both the mainboard segment and the mezzanine board segment, wherein passing data signals comprises passing data signals through the portions of the printed circuit board.

16. The method of claim 15, wherein a plane of the mainboard segment is coplanar a plane of the storage board segment when in the storage configuration, and wherein a plane of the mainboard segment is non-coplanar a plane of the storage board segment when in the deployed configuration.

17. The method of claim 16, wherein the storage second board segment, when in the deployed configuration, is configured for receiving an input/output device from a direction substantially perpendicular to the plane of the storage board segment and substantially parallel to the plane of the mainboard segment.

18. The method of claim 15, wherein the mainboard segment is couplable to a server mainboard and the storage board segment is a storage board couplable to a storage device, the method further comprising coupling the storage device to the storage board segment, and wherein the data signals are associated with the storage device.

19. The method of claim 15, wherein the mainboard segment supports a first connector couplable to a first motherboard, wherein the mezzanine board segment supports a second connector couplable to a second motherboard, and wherein the method further comprises:
coupling a plurality of storage devices to the storage board segment;
coupling a first storage device of the plurality of storage devices to the first motherboard via the first connector of the mainboard segment; and
coupling a second storage device of the plurality of storage devices to the second motherboard via the second connector of the mezzanine segment.

20. The method of claim 15, wherein the portions of the printed circuit board include a first flexible junction coupling the mainboard segment to a riser board segment and a second flexible junction coupling the riser board segment to the mezzanine board segment, and wherein when the mezzanine board segment is in the position parallel to and spaced apart from the mainboard segment, the riser board segment is perpendicular to the mainboard segment and the mezzanine board segment.

* * * * *